United States Patent
Hoefler et al.

(10) Patent No.: US 8,659,322 B2
(45) Date of Patent: Feb. 25, 2014

(54) MEMORY HAVING A LATCHING SENSE AMPLIFIER RESISTANT TO NEGATIVE BIAS TEMPERATURE INSTABILITY AND METHOD THEREFOR

(75) Inventors: Alexander B. Hoefler, Austin, TX (US); James D. Burnett, Austin, TX (US); Scott I. Remington, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 160 days.

(21) Appl. No.: 13/016,353

(22) Filed: Jan. 28, 2011

(65) Prior Publication Data

US 2012/0194222 A1  Aug. 2, 2012

(51) Int. Cl.
  *G11C 7/00*  (2006.01)
(52) U.S. Cl.
  USPC ............... 327/52; 327/57; 330/252; 330/261
(58) Field of Classification Search
  USPC ............... 330/252, 261; 327/52, 57
  See application file for complete search history.

(56) References Cited

U.S. PATENT DOCUMENTS

| | | | |
|---|---|---|---|
| 3,991,380 A * | 11/1976 | Pryor | 330/253 |
| 7,084,671 B1 | 8/2006 | Wendell et al. | |
| 7,177,201 B1 | 2/2007 | Takayanagi | |
| 7,688,669 B2 | 3/2010 | McClure et al. | |
| 7,760,537 B2 | 7/2010 | Urakawa | |
| 2003/0198112 A1 | 10/2003 | Eleyan et al. | |
| 2008/0048728 A1 * | 2/2008 | Hong et al. | 327/51 |
| 2008/0181024 A1 * | 7/2008 | Kim | 365/189.06 |
| 2011/0134708 A1 * | 6/2011 | Klein | 365/189.07 |
| 2011/0304358 A1 * | 12/2011 | Thompson et al. | 327/52 |
| 2012/0044779 A1 * | 2/2012 | Chuang et al. | 365/226 |

OTHER PUBLICATIONS

Butzen, P.F., et al., "Transistor Network Restructuring Against NBTI Degradation", in Microelectronics and Reliability, vol. 50, No. 9-11, pp. 1-6, 2010.

T. Takayanagi "A dual-core 64-bit UltraSPARC microprocessor for dense server applications", IEEE J. Solid-State Circuits, Jan. 2005, vol. 40, No. 1, pp. 7-18 2005.

* cited by examiner

*Primary Examiner* — Ryan Jager
(74) *Attorney, Agent, or Firm* — Daniel D. Hill; Jonathan N. Geld

(57) ABSTRACT

An integrated circuit includes a memory cell and a sense amplifier coupled to the memory cell via a first bit line and a second bit line. The sense amplifier includes first and second inverters cross-coupled to provide a latch. The first inverter is responsive to a first data signal provided by the memory cell over the first bit line. The second inverter is responsive to a second data signal as provided by the memory cell over the second bit line. A first negative bias temperature instability (NBTI) compensation transistor includes a source electrode coupled to receive a reference voltage, a drain electrode coupled to a source electrode of the first inverter, and a gate electrode coupled to first logic responsive to the first data signal. A second NBTI compensation transistor includes a source electrode coupled to receive the reference voltage, a drain electrode coupled to a source electrode of the second inverter, and a gate electrode coupled to second logic responsive to the second data signal, wherein the second data signal is a logical complement of the first data signal.

19 Claims, 3 Drawing Sheets

MEMORY HAVING A LATCHING SENSE AMPLIFIER RESISTANT TO NEGATIVE BIAS TEMPERATURE INSTABILITY AND METHOD THEREFOR

BACKGROUND

1. Field

This disclosure relates generally to integrated circuit memory, and more specifically, to a memory having a latching sense amplifier resistant to negative bias temperature instability (NBTI) and method therefor.

2. Related Art

A one-time programmable (OTP) memory is a type of memory that is used to permanently store programs or data in integrated circuit applications. An OTP memory cell may be implemented using, for example, fuses or antifuses. Read disturb can occur in an OTP memory cell as a result of read current being repeatedly applied to the OTP memory cell, such as an electrically programmable fuse or antifuse, and thus causing a stress condition in the OTP memory cell. Repeated read current stress can progressively alter the logic state of an OTP memory cell, and after a long time period move the cell from an unprogrammed state to a programmed state, causing an error. It is therefore desirable to read the OTP memory cell as little as possible. One way to avoid reading the OTP memory cell is to use a read operation to store the logic state of the OTP memory cell in a latching sense amplifier. For example, OTP memory cells may be used in a parallel block architecture where each OTP memory cell is coupled to a latching sense amplifier. The latching sense amplifiers can then be read in parallel. The sense amplifiers may include cross-coupled latches implemented using complementary metal oxide semiconductor (CMOS) process technology. If the system requires the logic state of the OTP memory cell, it can acquire the logic state from the latching sense amplifier without disturbing the OTP memory cell. This operation is called a "soft read". Only after an event, such as for example, a system on-off-on power cycle, another read operation has to be performed that actually reads from the OTP memory cell. This operation is commonly referred to as a "hard read". However, because the same data is always latched in the sense amplifiers, a threshold voltage (VTH) shift of PMOS (p-type metal oxide semiconductor) transistors in the sense amplifier latches can occur because of negative bias temperature instability (NBTI). NBTI drift results in a sense amplifier offset increasing over time and may result in incorrect sensing over a long time period.

Therefore, what is needed is a latching sense amplifier that solves the above problems.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
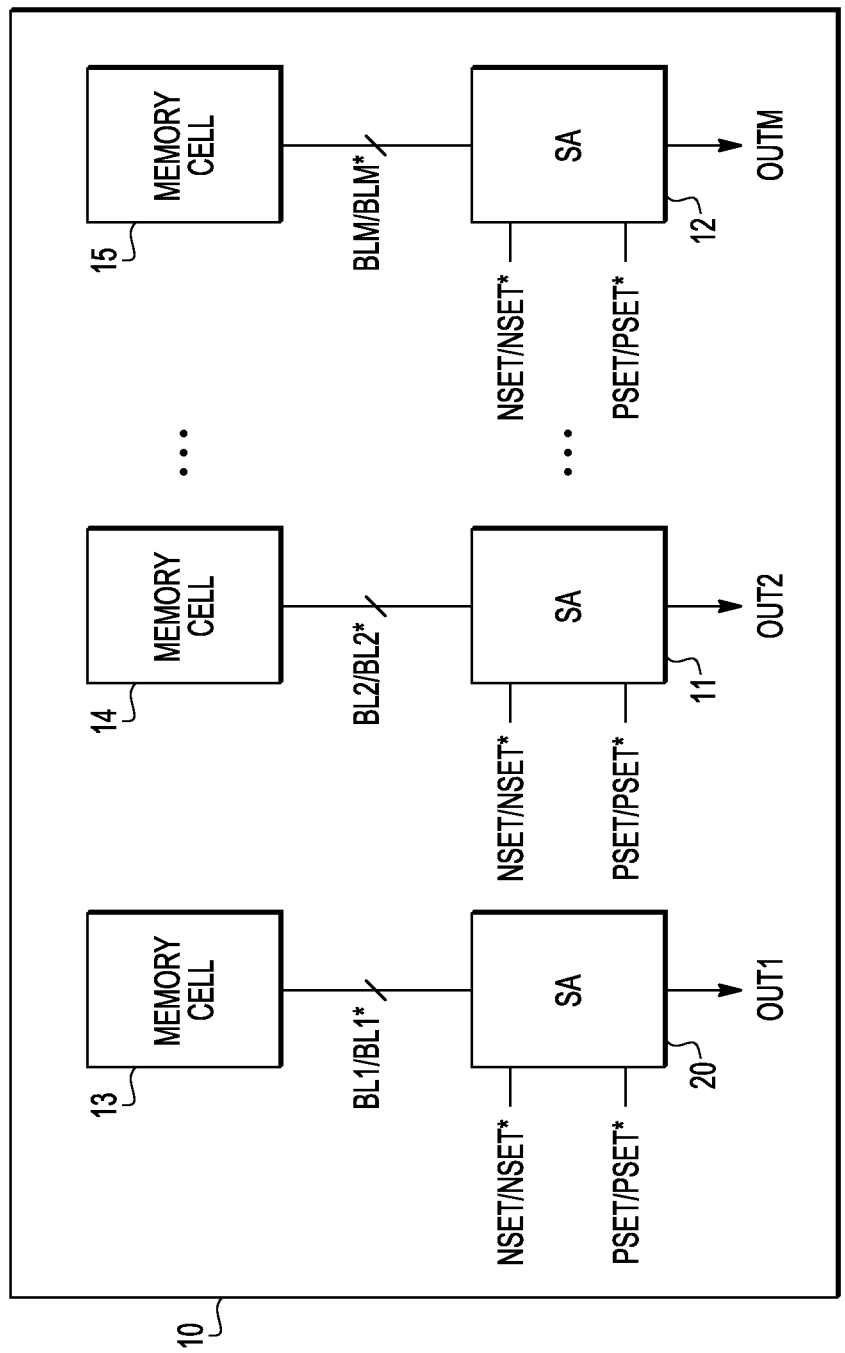
FIG. 1 illustrates, in block diagram form, an integrated circuit in accordance with an embodiment.

Generally, there is provided, a latching sense amplifier that is resistant to NBTI. The latching sense amplifier includes a cross-coupled latch having first and second inverters coupled between two storage nodes. Each inverter includes a P-channel transistor and an N-channel coupled together in series. A first NBTI compensation transistor has a source terminal coupled to a power supply voltage terminal. The first NBTI compensation transistor also has a drain terminal coupled to a source terminal of the P-channel transistor of the first inverter. A second NBTI transistor has a source terminal coupled to the power supply voltage terminal. The second NBTI transistor has a drain terminal coupled to a source terminal of the P-channel transistor of the second inverter. The first and second NBTI transistors are responsive to the logic states of the two storage nodes. A third NBTI compensation transistor is coupled between the drain terminals of the first and second NBTI compensation transistors. The NBTI compensation transistors are enabled during hold, or static, operation of the latching sense amplifier to balance the NBTI effects between the two transistor stacks so that a threshold voltage mismatch in the P-channel transistors of the cross-coupled latch does not affect the latching operation of the sense amplifier over time.

In one aspect, there is provided, an integrated circuit comprising: a memory cell; and a sense amplifier, coupled to the memory cell via a first and second bit line, comprising: a first inverter responsive to a first data signal provided by the memory cell over the first bit line, a second inverter responsive to a second data signal as provided by the memory cell over the second bit line, wherein the second inverter is cross coupled to the first inverter, a first negative bias temperature instability (NBTI) compensation transistor comprising a source electrode coupled to a reference voltage, a drain electrode coupled to a source electrode of the first inverter, and a gate electrode coupled to first logic responsive to one of the first or second data signals, and a second NBTI compensation transistor comprising a source electrode coupled to the reference voltage, a drain electrode coupled to a source electrode of the second inverter, and a gate electrode coupled to second logic responsive to one of the first or second data signals, wherein the second data signal is a logical complement of the first data signal. The sense amplifier may further comprise an equilibrium transistor comprising a first source/drain electrode coupled to the drain electrode of the first NBTI compensation transistor and the source electrode of the first inverter, a second source/drain electrode coupled to the drain electrode of the second NBTI compensation transistor and the source electrode of the second inverter, and a gate electrode coupled to receive an enable signal. The equilibrium transistor may be on during a hold mode of the sense amplifier. The equilibrium transistor may be off during a sense mode of the sense amplifier. The first NBTI compensation transistor and the second NBTI compensation transistor may be p-channel transistors. The memory cell may be a one-time programmable memory cell. The memory cell may be one of a plurality of memory cells coupled to the first and second bit lines. The integrated circuit may further comprise: a supply voltage bias circuit comprising: a first supply voltage bias transistor comprising a source electrode coupled to a supply voltage of the sense amplifier, a drain electrode coupled to the source electrode of the first NBTI transistor and the source electrode of the second NBTI transistor, and a gate electrode coupled to receive an enable signal, and a second supply voltage bias transistor comprising a source electrode coupled to the supply voltage of the sense amplifier, a drain electrode coupled to the source electrode of the first NBTI transistor and the source electrode of the second NBTI transistor, and a gate electrode coupled to the drain electrode of the first and second source voltage bias transistors.

In another aspect, there is provided, a sense amplifier circuit comprising: a first inverter comprising a first transistor and a second transistor, wherein the first transistor comprises a source electrode, a drain electrode coupled to a first data node, and a gate electrode coupled to a second data node, and the second transistor comprises a drain electrode coupled to the first data node, a source electrode, and a gate electrode coupled to the gate electrode of the first transistor; a second inverter comprising a third transistor and a fourth transistor, wherein the third transistor comprises a source electrode coupled to the source electrode of the first transistor, a drain electrode coupled to the second data node, and a gate electrode coupled to the first data node, and a fourth transistor comprises a drain electrode coupled to the second data node, a source electrode coupled to the source electrode of the second transistor, and a gate electrode coupled to the gate electrode of the third transistor; a first negative bias temperature instability (NBTI) compensation transistor comprising a source electrode coupled to a reference voltage, a drain electrode coupled to the source electrode of the first transistor, and a gate electrode; a second NBTI compensation transistor comprising a source electrode coupled to the reference voltage, a drain electrode coupled to the source electrode of the third transistor and the drain electrode of the first NBTI compensation transistor, and a gate electrode; a first logic comprising an input coupled to the first data node and an output coupled to the gate electrode of the first NBTI compensation transistor, wherein the first logic is responsive to a first signal provided by the first data node and an enable signal; and a second logic comprising an input coupled to the second data node and an output coupled to the gate electrode of the second NBTI compensation transistor, wherein the second logic is responsive to a second signal provided by the second data node and the enable signal. The sense amplifier circuit may further comprise: the first logic configured to couple the first data node to the gate of the first NBTI compensation transistor in response to a logic high enable signal, and couple the gate of the first NBTI compensation transistor to ground potential in response to a logic low enable signal. The second logic may be configured to couple the second data node to the gate of the second NBTI compensation transistor in response to the logic high enable signal, and couple the gate of the first NBTI compensation transistor to ground potential in response to the logic low enable signal. The second data signal may be a logical complement to the first data signal. The sense amplifier circuit may further comprise: an equilibrium transistor comprising: a first source/drain electrode coupled to the drain electrode of the first NBTI compensation transistor and the source electrode of the first transistor, a second source/drain electrode coupled to the drain electrode of the second NBTI compensation transistor and the source electrode of the third transistor, and a gate electrode coupled to receive the logical complement of the enable signal, wherein the equilibrium transistor couples the drain electrode of the first NBTI compensation transistor and the source electrode of the first transistor to the drain electrode of the second NBTI compensation transistor and the source electrode of the third transistor. The first and second NBTI compensation transistors may be p-channel transistors. The first transistor and the third transistor may be p-channel transistors. The sense amplifier circuit may further comprise: a first bit line coupled to a memory cell; a second bit line coupled to the memory cell, wherein the first signal is responsive to a data signal provided by the memory cell over the first bit line, and the second signal is responsive to a logical complement of the data signal provided by the memory cell over the second bit line. The memory cell may be a one-time programmable memory cell. The memory cell may be one of a plurality of memory cells coupled to the first and second bit lines.

In yet another aspect, there is provided, a method for compensating for negative bias temperature instability (NBTI) in a sense amplifier, the method comprising: storing first and second data signals using corresponding first and second inverter circuits in a latch, wherein a supply voltage path of the first inverter circuit is coupled to a drain of a first NBTI compensation transistor, and a supply voltage path of the second inverter circuit is coupled to a drain of a second NBTI compensation transistor; when the latch is in a hold state coupling a gate of the first NBTI compensation transistor to a data node of the first inverter circuit, and coupling a gate of the second NBTI compensation transistor to a data node of the second inverter circuit; and when the latch is in a sense state coupling the gate of the first NBTI compensation transistor and the gate of the second NBTI compensation transistor to a ground potential. The method may further comprise: enabling an equilibration device coupling the drains of the first and second NBTI compensation transistors when the latch is in the hold state; and disabling the equilibration device when the latch is in the sense state. The method may further comprise providing the first and second data signals from a one-time programmable memory cell.

The semiconductor substrate described herein can be any semiconductor material or combinations of materials, such as gallium arsenide, silicon germanium, silicon-on-insulator (SOI), silicon, monocrystalline silicon, the like, and combinations of the above.

As used herein the term metal-oxide-semiconductor and the abbreviation MOS are to be interpreted broadly, in particular, it should be understood that they are not limited merely to structures that use "metal" and "oxide" but may employ any type of conductor including "metal" and any type of dielectric including "oxide". The term field effect transistor is abbreviated as "FET".

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

FIG. 1 illustrates, in block diagram form, an integrated circuit 10 in accordance with an embodiment. Integrated circuit 10 includes a one-time programmable (OTP) memory having a plurality of memory cells. Each memory cell is coupled to a corresponding sense amplifier. There is a one-to-one correspondence between memory cells and sense amplifiers. For example, in FIG. 1 representative sense amplifiers 20, 11, and 12, are coupled to memory cells 13, 14, and 15, respectively. Note that sense amplifiers 20, 11, and 12 are identical in the illustrated embodiment. Each of the OTP memory cells may be implemented as a fuse, antifuse, or other type of OTP memory cell. In another embodiment, another type of non-volatile or volatile memory cells may be used, such as for example, memory cells including read only memory (ROM) cells, electrically erasable programmable read only memory (EEPROM) cells, flash memory cells, dynamic random access memory (DRAM) cells, and static random access memory (SRAM) cells. Also, in another embodiment, the sense amplifiers may each be shared among a plurality of memory cells.

In FIG. 1, a bit line pair labeled "BL1/BL1*" is coupled between memory cell 13 and sense amplifier 20, a bit line pair labeled "BL2/BL2*" is coupled between memory cell 14 and sense amplifier 11, and a bit line pair labeled "BLM/BLM*" is coupled between memory cell 15 and sense amplifier 12. In another embodiment, a single bit line may be used instead of a bit line pair. There can be any number of single bit lines or bit line pairs. Each sense amplifier has an output terminal for providing a data signal corresponding to the stored logic state of the OTP memory cell coupled to the sense amplifier. Sense amplifier 20 has an output terminal labeled "OUT1, sense amplifier 11 has an output terminal labeled "OUT2", and sense amplifier 12 has an output terminal labeled "OUTM". Output terminal OUTM is the output of the Mth sense amplifier where M can be any integer. During a read operation, data can be read from the memory cells in parallel. Each of sense amplifiers 20, 11, and 12 receives control signals labeled "NSET/NSET*" and "PSET/PSET*". When NSET and PSET set are asserted, latching sense amplifiers 20, 11, and 12 are enabled in a hold, or static, mode for retaining a data bit. When control signals NSET and PSET are negated, latching sense amplifiers 20, 11, and 12 can be written to. In the illustrated case, where each latching sense amplifier is only coupled to one OTP memory cell, the latching sense amplifier will only ever store one logic state after the OTP memory cells are programmed because the OTP memory cells cannot be reprogrammed. One of the P-channel transistors of the latch portion of the latching sense amplifiers will therefore always be on and the other will be always off during the hold mode. This will lead to the problem of an imbalance in threshold voltages of the P-channel transistors in the latch caused by NBTI effects to the P-channel transistor that is always on. In accordance with the illustrated embodiment, the level of the VTH imbalance is offset by the use of NBTI compensation transistors to distribute the NBTI effect substantially equally between two legs of the sense amplifiers. The operation of the latching sense amplifier will be described below with reference to FIG. 2.

Figure 2:
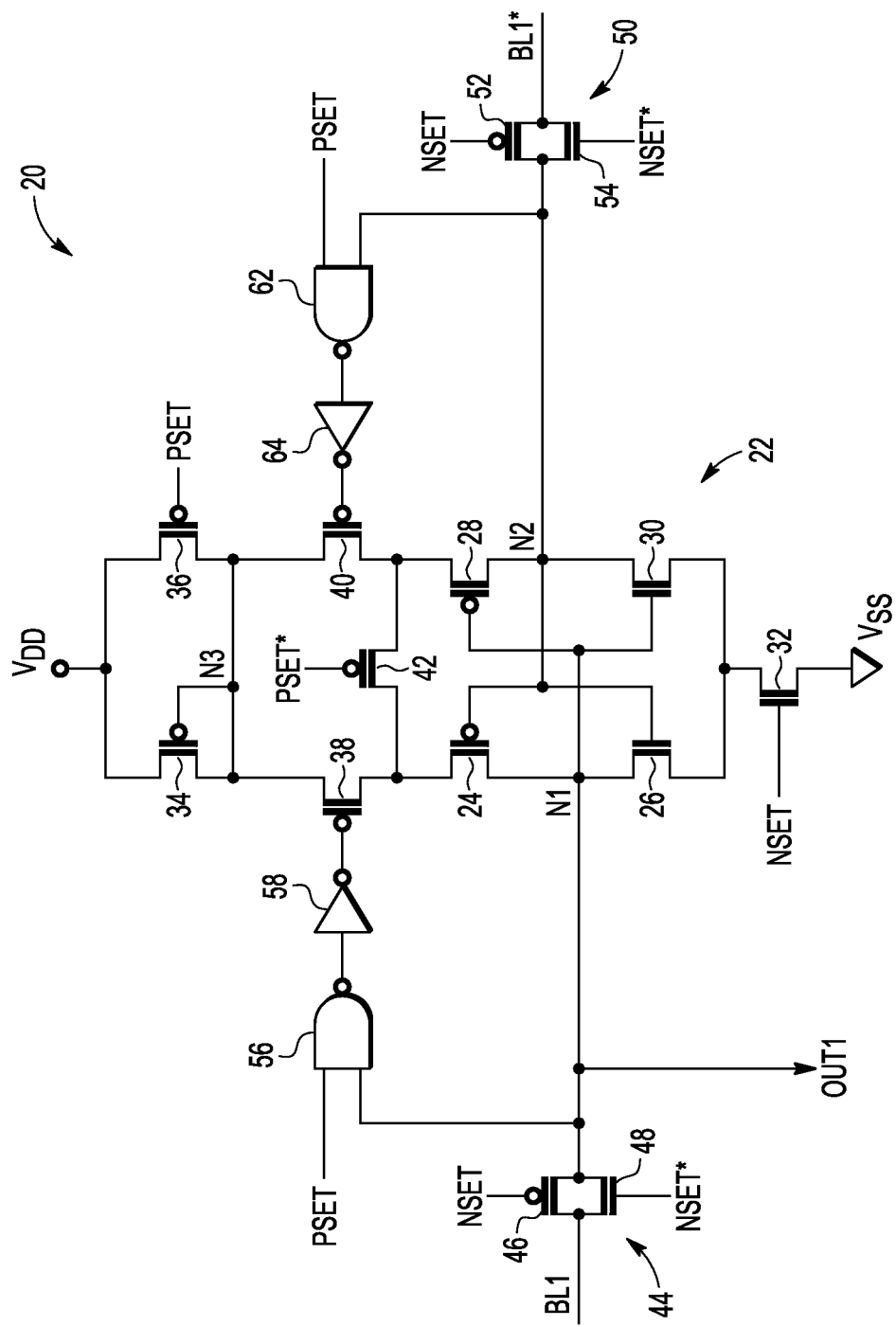
FIG. 2 illustrates, in partial schematic diagram form and partial logic diagram form, an embodiment of the latching sense amplifier of the integrated circuit of FIG. 1 in more detail.

FIG. 2 illustrates, in partial schematic diagram form and partial logic diagram form, latching sense amplifier 20 of integrated circuit 10 of FIG. 1 in more detail. Latching sense amplifier 20 includes P-channel transistors 24, 28, 34, 36, 38, 40, 42, 46, and 52, N-channel transistors 26, 30, 32, 48, and 54, NAND logic gates 56 and 62, and inverters 58 and 64. Transistors 24, 26, 28, and 30 are connected together to form cross-coupled latch 22. P-channel transistor 46 and N-channel transistor 48 form a transmission gate 44, and P-channel transistor 52 and N-channel transistor 54 form a transmission gate 50. P-channel transistor 34 has a source (current electrode) connected to a power supply voltage terminal labeled "VDD", a drain (current electrode) connected to an internal node labeled "N3", and a gate (control electrode) connected to node N3. P-channel transistor 36 has a source connected to VDD, a drain connected to node N3, and a gate for receiving control signal PSET. P-channel transistor 38 has a source connected to node N3, a drain, and a gate. P-channel transistor 40 has a source connected to node N3, a drain, and a gate. P-channel equilibrium transistor 42 has a first source/drain terminal connected to the drain of transistor 38, a second source/drain terminal connected to the drain of transistor 40, and a gate for receiving control signal PSET*. P-channel transistor 24 and N-channel transistor 26 form an inverter, and P-channel transistor 28 and N-channel transistor 30 form an inverter. P-channel transistor 24 has a source connected to the drain of transistor 38, a drain connected to storage node N1, and a gate connected to storage node N2. N-channel transistor 26 has a drain connected to storage node N1, a source, and a gate connected to the gate of transistor 24 at node N2. P-channel transistor 28 has a source connected to the drain of transistor 40, a drain connected to node N2, and a gate connected to storage node N1. N-channel transistor 30 has a drain connected to the drain of transistor 28 at storage node N2, a source connected to the source of transistor 26, and a gate connected to the gate of transistor 28 at storage node N1. N-channel transistor 32 has a drain connected to the sources of transistors 26 and 30, a source connected to a power supply voltage terminal labeled "VSS", and a gate for receiving a control signal labeled "NSET". P-channel transistor 46 has a first source/drain terminal connected to node N1, a second source/drain terminal connected to bit line BL1, and a gate for receiving control signal NSET. N-channel transistor 48 has a first source/drain terminal connected to node N1, a second source/drain terminal connected to bit line BL1, and a gate for receiving NSET*. P-channel transistor 52 has a first source/drain terminal connected to the node N2, a second source/drain terminal connected to bit line BL1*, and a gate for receiving control signal NSET. N-channel transistor 54 has a first source/drain terminal connected to node N2, a second source/drain terminal connected to bit line BL1*, and a gate for receiving control signal NSET*. NAND logic gate 56 has a first input terminal for receiving PSET, a second input terminal connected to node N1, and an output terminal. Inverter 58 has an input terminal connected to the output terminal of NAND logic gate 56, and an output terminal connected to the gate of transistor 38. NAND logic gate 62 has a first input for receiving control signal PSET, a second input connected to storage node N2, and an output terminal. Inverter 64 has an input connected to the output of NAND logic gate 62, and an output connected to the gate of transistor 40. Note that in the illustrated embodiment, VDD is coupled to receive a positive power supply voltage, such as for example 0.9 volts, and VSS is coupled to ground. In another embodiment, the power supply voltage may be different.

In operation, the logic state of a memory cell connected to sense amplifier 20 must first be provided to and stored in latching sense amplifier 20. To read the logic state of a memory cell coupled to latching sense amplifier 20, control signals NSET and PSET are asserted as logic low voltages. In response, P-channel transistor 36 is conductive, causing a full power supply voltage VDD to be provided to node N3. N-channel transistor 32 is substantially non-conductive. P-channel transistor 42 is substantially non-conductive, and P-channel transistors 38 and 40 are conductive. Transmission gates 44 and 50 are both conductive causing a differential data signal on bit lines BL1 and BL1* to be provided to storage nodes N1 and N2, respectively. Cross-coupled latch 22 stores the logic state of the data signal as a differential voltage on storage nodes N1 and N2. For example, if node N1 is storing a logic low and node N2 is storing a logic high, P-channel transistor 24 will be off and N-channel transistor 26 will be on, pulling the voltage of node N1 to VSS. Likewise, P-channel transistor 28 will be on and N-channel transistor 30 will be off, causing node N2 to be pulled by transistor 28 toward VDD. To make writing the logic state of the OTP memory cell to latch 22 easier and less stressful to the OTP memory cell, N-channel transistor 32 is made non-conductive before making transmission gates 44 and 50 conductive. After nodes N1 and N2 have been exposed to the logic state of the OTP memory cell, transmission gates 44 and 50 are made substantially non-conductive and N-channel transistor 32 is made conductive causing the differential voltage of nodes N1 and N2 to further separate. Because the logic state of the OTP memory cell will never change, transistors 28 and 26 of cross-coupled inverters 22 will always be on and transistors 24 and 30 will always be off during data hold mode. P-channel transistor 28 will therefore be subjected to more NBTI stress than P-channel transistor 24 and an offset may occur in their threshold voltages.

To balance the NBTI stress caused by storing the same logic state over a long time period, the logic state of storage nodes N1 and N2 are used to determine which of transistors 38 and 40 is made conductive to supply a voltage to the latch having cross-coupled inverters 22. In the above example, if storage node N1 is a logic low, storage node N2 is a logic high, and control signals PSET and NSET are asserted as logic high voltages for operation in hold mode, the gate of transistor 38 will receive a logic low causing transistor 38 to be conductive, and the gate of transistor 40 will receive a logic high from inverter 64 causing transistor 40 to be substantially non-conductive. P-channel transistor 42 is conductive, so the source terminals of transistors 24 and 28 will both receive the same reference voltage through transistor 38. Transistor 28 will still be NBTI stressed more than transistor 24, but transistor 38 will be NBTI stressed to compensate for the NBTI stress of transistor 28. A series connection of transistors 24 and 38 will have the same cumulative threshold voltage as a series connection of transistors 28 and 40.

To further reduce NBTI stress on all of the P-channel transistors of sense amplifier 20 during data hold operation, P-channel transistor 36 is made substantially non-conductive by the logic high PSET signal so that the sense amplifier is supplied only by diode-connected P-channel transistor 34. Node N3 will be at a relatively lower voltage than VDD, causing the P-channel transistors of the sense amplifier to have a slightly less negative gate-to-source voltage (VGS).

Note that in the illustrated embodiment, the logic state stored in the OTP memory cell is read from latching sense amplifier 20 instead of from the OTP memory cell directly. Output signal OUT1 from node N1 is a single-ended signal. In another embodiment, the logic states of both N1 and N2 may be provided as differential output signals instead of a single-ended signal.

Figure 3:
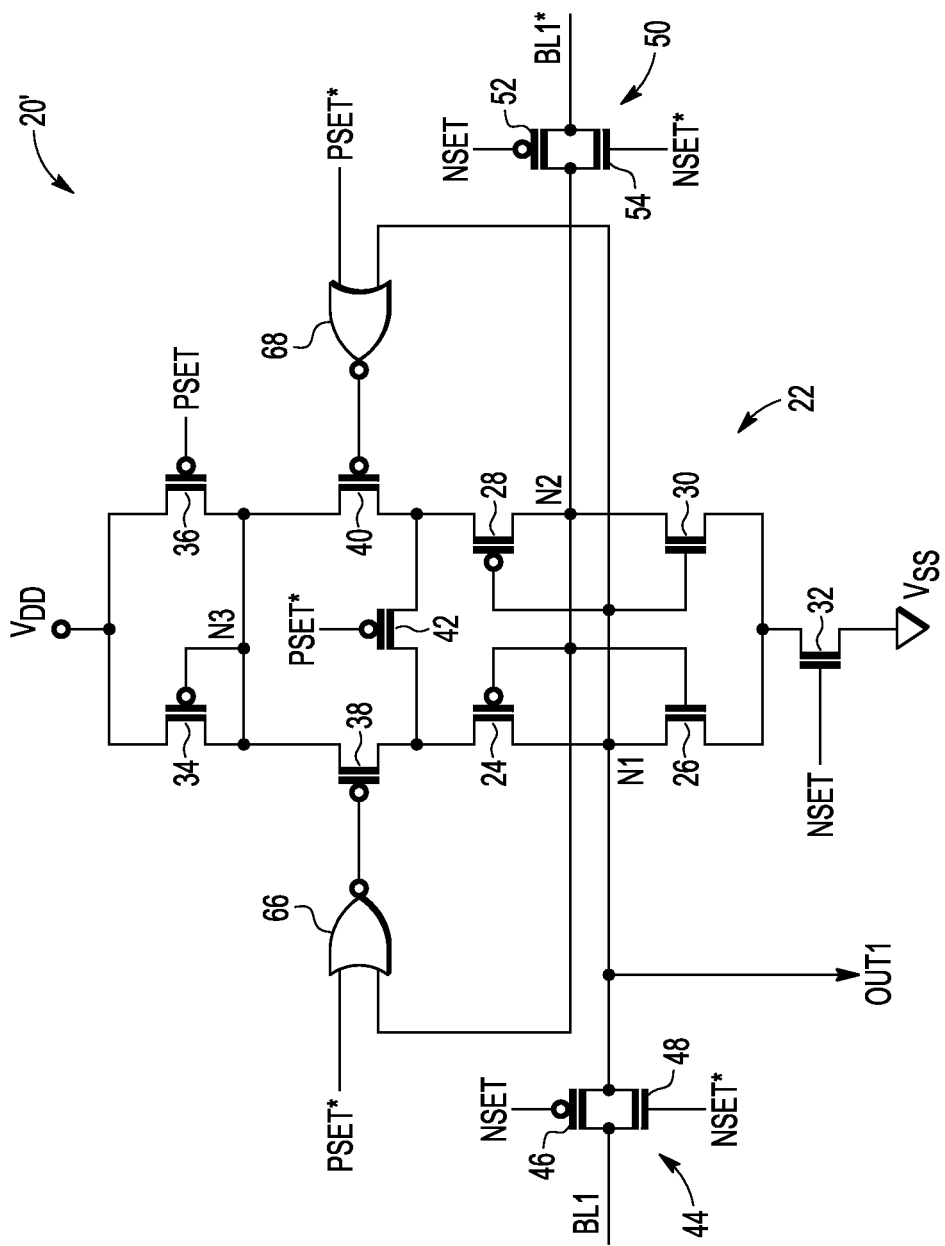
FIG. 3 illustrates, in partial schematic diagram form and partial logic diagram form, another embodiment of the latching sense amplifier of the integrated circuit of FIG. 1 in more detail.

FIG. 3 illustrates, in partial schematic diagram form and partial logic diagram form, a latching sense amplifier 20' for use in the integrated circuit of FIG. 1. Latching sense amplifier 20' is substantially the same as latching sense amplifier 20 of FIG. 2 except that the NOR logic gates 66 and 68 are used instead of the NAND logic gates 56 and 62 and inverters 58 and 64 illustrated in FIG. 2. Also, note that signal PSET* is used as an input instead of signal PSET.

NOR logic gate 66 has a first input coupled to receive signal PSET*, a second input connected to node N2, and an output connected to the gate of transistor 38. NOR logic gate 68 has a first input coupled to receive signal PSET*, a second input connected to node N1, and an output connected to the gate of transistor 40. Note that in the illustrated embodiment, VDD is coupled to receive a positive power supply voltage, such as for example, 0.9 volts, and VSS is coupled to ground. In another embodiment, the power supply voltage may be different.

Note that in other embodiments, one of ordinary skill in the art will know that different combinations of logic from those illustrated can be used to control transistors 38 and 40.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
a memory cell; and
a sense amplifier coupled to the memory cell via a first and second bit line, comprising:
a first inverter responsive to a first data signal provided by the memory cell over the first bit line,
a second inverter responsive to a second data signal provided by the memory cell over the second bit line, wherein the second inverter is cross-coupled to the first inverter,
a first negative bias temperature instability (NBTI) compensation transistor comprising a source electrode coupled to a reference voltage, a drain electrode coupled to a source electrode of the first inverter, and a gate electrode coupled to first logic responsive to one of the first or second data signals, a second NBTI compensation transistor comprising a source electrode coupled to the reference voltage, a drain electrode coupled to a source electrode of the second inverter, and a gate electrode coupled to second logic responsive to one of the first or second data signals, wherein the second data signal is a logical complement of the first data signal, and an equilibrium transistor comprising a first source/drain electrode coupled to the drain electrode of the first NBTI compensation transistor and the source electrode of the first inverter, a second source/drain electrode coupled to the drain electrode of the second NBTI compensation transistor and the source electrode of the second inverter, and a gate electrode coupled to receive an enable signal.

2. The integrated circuit of claim 1 wherein the equilibrium transistor is on during a hold mode of the sense amplifier.

3. The integrated circuit of claim 1 wherein the equilibrium transistor is off during a sense mode of the sense amplifier.

4. The integrated circuit of claim 1 wherein the first NBTI compensation transistor and the second NBTI compensation transistor are p-channel transistors.

5. The integrated circuit of claim 1 wherein the memory cell is a one-time programmable memory cell.

6. The integrated circuit of claim 1 wherein the memory cell is one of a plurality of memory cells coupled to the first and second bit lines.

7. An integrated circuit comprising:
a memory cell; and
a sense amplifier coupled to the memory cell via a first and second bit line, comprising:
a first inverter responsive to a first data signal provided by the memory cell over the first bit line,
a second inverter responsive to a second data signal provided by the memory cell over the second bit line, wherein the second inverter is cross-coupled to the first inverter,
a first negative bias temperature instability (NBTI) compensation transistor comprising a source electrode coupled to a reference voltage, a drain electrode coupled to a source electrode of the first inverter, and a gate electrode coupled to first logic responsive to one of the first or second data signals,
a second NBTI compensation transistor comprising a source electrode coupled to the reference voltage, a drain electrode coupled to a source electrode of the second inverter, and a gate electrode coupled to second logic responsive to one of the first or second data signals, wherein the second data signal is a logical complement of the first data signal, and
a supply voltage bias circuit comprising
a first supply voltage bias transistor comprising a source electrode coupled to a supply voltage of the sense amplifier, a drain electrode coupled to the source electrode of the first NBTI transistor and the source electrode of the second NBTI transistor, and a gate electrode coupled to receive an enable signal, and
a second supply voltage bias transistor comprising a source electrode coupled to the supply voltage of the sense amplifier, a drain electrode coupled to the source electrode of the first NBTI transistor and the source electrode of the second NBTI transistor, and a gate electrode coupled to the drain electrode of the first and second source voltage bias transistors.

8. A sense amplifier circuit comprising:
a first inverter comprising a first transistor and a second transistor, wherein
the first transistor comprises a source electrode, a drain electrode coupled to a first data node, and a gate electrode coupled to a second data node, and
the second transistor comprises a drain electrode coupled to the first data node, a source electrode, and a gate electrode coupled to the gate electrode of the first transistor;
a second inverter comprising a third transistor and a fourth transistor, wherein
the third transistor comprises a source electrode coupled to the source electrode of the first transistor, a drain electrode coupled to the second data node, and a gate electrode coupled to the first data node, and
a fourth transistor comprises a drain electrode coupled to the second data node, a source electrode coupled to the source electrode of the second transistor, and a gate electrode coupled to the gate electrode of the third transistor;
a first negative bias temperature instability (NBTI) compensation transistor comprising a source electrode coupled to a reference voltage, a drain electrode coupled to the source electrode of the first transistor, and a gate electrode;
a second NBTI compensation transistor comprising a source electrode coupled to the reference voltage, a drain electrode coupled to the source electrode of the third transistor and the drain electrode of the first NBTI compensation transistor, and a gate electrode;
a first logic comprising an input coupled to the first data node and an output coupled to the gate electrode of the first NBTI compensation transistor, wherein the first logic is responsive to a first signal provided by the first data node and an enable signal;
a second logic comprising an input coupled to the second data node and an output coupled to the gate electrode of the second NBTI compensation transistor, wherein the second logic is responsive to a second signal provided by the second data node and the enable signal; and
a supply voltage bias circuit coupled between the first and second NBTI transistors and a supply voltage of the sense amplifier, wherein the supply voltage bias circuit includes
a first supply voltage bias transistor comprising a source electrode coupled to the supply voltage of the sense amplifier, a drain electrode coupled to the source electrode of the first NBTI transistor and the source electrode of the second NBTI transistor, and a gate electrode coupled to receive an enable signal, and
a second supply voltage bias transistor comprising a source electrode coupled to the supply voltage of the sense amplifier, a drain electrode coupled to the source electrode of the first NBTI transistor and the source electrode of the second NBTI transistor, and a gate electrode coupled to the drain electrode of the first and second source voltage bias transistors.

9. The sense amplifier circuit of claim 8 further comprising:
the first logic is configured to couple the first data node to the gate of the first NBTI compensation transistor in response to a logic high enable signal, and
the first logic is configured to couple the gate of the first NBTI compensation transistor to ground potential in response to a logic low enable signal; and
the second logic is configured to couple the second data node to the gate of the second NBTI compensation transistor in response to the logic high enable signal, and the second logic is configured to couple the gate of the first NBTI compensation transistor to ground potential in response to the logic low enable signal.

10. The sense amplifier circuit of claim 8 wherein the second data signal is a logical complement to the first data signal.

11. The sense amplifier circuit of claim 8 wherein the first and second NBTI compensation transistors are p-channel transistors.

12. The sense amplifier circuit of claim 11 wherein the first transistor and the third transistor are p-channel transistors.

13. The sense amplifier circuit of claim 8 further comprising:
a first bit line coupled to a memory cell;
a second bit line coupled to the memory cell, wherein
the first signal is responsive to a data signal provided by the memory cell over the first bit line, and
the second signal is responsive to a logical complement of the data signal provided by the memory cell over the second bit line.

14. The sense amplifier circuit of claim 13 wherein the memory cell is a one-time programmable memory cell.

15. The sense amplifier circuit of claim 13 wherein the memory cell is one of a plurality of memory cells coupled to the first and second bit lines.

16. A sense amplifier circuit comprising:
a first inverter comprising a first transistor and a second transistor, wherein
the first transistor comprises a source electrode, a drain electrode coupled to a first data node, and a gate electrode coupled to a second data node, and
the second transistor comprises a drain electrode coupled to the first data node, a source electrode, and a gate electrode coupled to the gate electrode of the first transistor;
a second inverter comprising a third transistor and a fourth transistor, wherein
the third transistor comprises a source electrode coupled to the source electrode of the first transistor, a drain electrode coupled to the second data node, and a gate electrode coupled to the first data node, and
a fourth transistor comprises a drain electrode coupled to the second data node, a source electrode coupled to the source electrode of the second transistor, and a gate electrode coupled to the gate electrode of the third transistor;
a first negative bias temperature instability (NBTI) compensation transistor comprising a source electrode coupled to a reference voltage, a drain electrode coupled to the source electrode of the first transistor, and a gate electrode;
a second NBTI compensation transistor comprising a source electrode coupled to the reference voltage, a drain electrode coupled to the source electrode of the third transistor and the drain electrode of the first NBTI compensation transistor, and a gate electrode;
a first logic comprising an input coupled to the first data node and an output coupled to the gate electrode of the first NBTI compensation transistor, wherein the first logic is responsive to a first signal provided by the first data node and an enable signal;
a second logic comprising an input coupled to the second data node and an output coupled to the gate electrode of the second NBTI compensation transistor, wherein the second logic is responsive to a second signal provided by the second data node and the enable signal; and
an equilibrium transistor comprising:
a first source/drain electrode coupled to the drain electrode of the first NBTI compensation transistor and the source electrode of the first transistor,
a second source/drain electrode coupled to the drain electrode of the second NBTI compensation transistor and the source electrode of the third transistor, and
a gate electrode coupled to receive the logical complement of the enable signal, wherein the equilibrium transistor couples the drain electrode of the first NBTI compensation transistor and the source electrode of the first transistor to the drain electrode of the second NBTI compensation transistor and the source electrode of the third transistor.

17. A method for compensating for negative bias temperature instability (NBTI) in a sense amplifier, the method comprising:
storing first and second data signals using corresponding first and second inverter circuits in a latch, wherein
a supply voltage path of the first inverter circuit is coupled to a drain of a first NBTI compensation transistor, and
a supply voltage path of the second inverter circuit is coupled to a drain of a second NBTI compensation transistor;
coupling a gate of the first NBTI compensation transistor to a data node of the first inverter circuit when the latch is in a hold state, and
coupling a gate of the second NBTI compensation transistor to a data node of the second inverter circuit;
coupling the gate of the first NBTI compensation transistor and the gate of the second NBTI compensation transistor to a ground potential when the latch is in a sense state; and
coupling a supply voltage bias circuit between the first and second NBTI transistors and a supply voltage of the sense amplifier, wherein the supply voltage bias circuit is coupled between the first and second NBTI transistors and the supply voltage by:
coupling a source electrode of a first supply voltage bias transistor to the supply voltage,
coupling a drain electrode of the first supply voltage bias transistor to the source electrode of the first NBTI transistor and the source electrode of the second NBTI transistor,
coupling a gate electrode of the first supply voltage bias transistor to receive an enable signal,
coupling a source electrode of a second supply voltage bias transistor to the supply voltage,
coupling a drain electrode of the second supply voltage bias transistor to the source electrode of the first NBTI transistor and the source electrode of the second NBTI transistor, and
coupling a gate electrode of the second supply voltage bias transistor to the drain electrode of the first and second source voltage bias transistors.

18. The method of claim 17 further comprising:
providing the first and second data signals from a one-time programmable memory cell.

19. A method for compensating for negative bias temperature instability (NBTI) in a sense amplifier, the method comprising:
storing first and second data signals using corresponding first and second inverter circuits in a latch, wherein
a supply voltage path of the first inverter circuit is coupled to a drain of a first NBTI compensation transistor, and
a supply voltage path of the second inverter circuit is coupled to a drain of a second NBTI compensation transistor;

coupling a gate of the first NBTI compensation transistor to a data node of the first inverter circuit when the latch is in a hold state, and
coupling a gate of the second NBTI compensation transistor to a data node of the second inverter circuit;
coupling the gate of the first NBTI compensation transistor and the gate of the second NBTI compensation transistor to a ground potential when the latch is in a sense state;
enabling an equilibration device coupling the drains of the first and second NBTI compensation transistors when the latch is in the hold state; and
disabling the equilibration device when the latch is in the sense state.

* * * * *